United States Patent [19]

Hayakawa et al.

[11] 4,280,132
[45] Jul. 21, 1981

[54] MULTI-LEAD FRAME MEMBER WITH MEANS FOR LIMITING MOLD SPREAD

[75] Inventors: Masao Hayakawa, Kyoto; Takamichi Maeda, Yamatokoriyama; Masao Kumura, Nara, all of Japan

[73] Assignee: Sharp Kabushiki Kaisha, Osaka, Japan

[21] Appl. No.: 84,542

[22] Filed: Oct. 15, 1979

Related U.S. Application Data

[63] Continuation of Ser. No. 872,314, Jan. 25, 1978.

[30] Foreign Application Priority Data

Jan. 25, 1977 [JP] Japan .................................. 52-7972

[51] Int. Cl.³ .................... H01L 23/48; H01L 29/44; H01L 29/60
[52] U.S. Cl. ........................................ 357/70; 357/72; 357/80; 357/68; 29/588
[58] Field of Search ................ 357/68, 70, 72, 80; 29/588

[56] References Cited

U.S. PATENT DOCUMENTS

| | | | |
|---|---|---|---|
| 3,265,806 | 8/1966 | Burks et al. | 357/70 |
| 3,381,071 | 4/1968 | Logan et al. | 357/80 |
| 3,570,115 | 3/1971 | Barnes | 357/80 |
| 3,689,336 | 9/1972 | Bunker et al. | 357/70 |
| 3,864,820 | 2/1975 | Brenan et al. | 357/70 |
| 3,938,177 | 2/1976 | Hansen et al. | 357/70 |
| 4,086,696 | 5/1978 | Ikuta | 357/70 |
| 4,107,555 | 8/1978 | Haas et al. | 357/80 |
| 4,164,811 | 8/1979 | Heywang | 357/72 |

*Primary Examiner*—Andrew J. James
*Attorney, Agent, or Firm*—Birch, Stewart, Kolasch & Birch

[57] ABSTRACT

Blocking members are provided for limiting mold spread over a desirable area while a semiconductor is molded. The blocking members are composed within a metallic layer together with metallic leads by photo-etching techniques. The blocking members are positioned at four corners of an aperture in a predetermined pattern of generally radial fingers extending cantilever-wise inwardly beyond the periphery of the aperture. The semiconductor is adapted to engage bumps on the semiconductor to the metallic leads by wire bonding methods. Extended portions of the metallic leads may also function as the blocking members, with the metallic leads being positioned at the four corners of the aperture.

6 Claims, 3 Drawing Figures

MULTI-LEAD FRAME MEMBER WITH MEANS FOR LIMITING MOLD SPREAD

This application is a continuation of copending application Ser. No. 872,314, filed on Jan. 25, 1978.

BACKGROUND OF THE INVENTION

The present invention relates to a semiconductor device, more particularly, to such device as integrated circuits or multiple circuits on a single substrate with a corresponding large number of circuit connections and corresponding leads out of the device.

Prior art blocking members for limiting the spread of plastic flash outside of a mold cavity is disclosed in U.S. Pat. No. 3,611,061 assigned to Motorola, Inc. on Oct. 5, 1971. However, the blocking members, namely, lead spacers are provided separate from a mounting portion for mounting an electronic unit and the blocking members are formed within a portion of a metallic strip. Therefore, it is not sufficient for blocking purposes of mold spread in the above blocking members.

OBJECTS AND SUMMARY OF THE INVENTION

Accordingly, an object of the present invention is to provide an improved frame member for fabricating a multiple lead integrated circuit.

Another object of the present invention is to provide an improved frame member, wherein a yield for fabricating the multiple lead integrated circuit is reduced.

Other objects and further scope of applicability of the present invention will become apparent from the detailed description given hereinafter. It should be understood, however, that the detailed description and the specific examples, while including preferred embodiments of the invention, are given by way of illustration only, since various changes and modifications within the sprit and scope of the invention will become apparent to those skilled in the art from this detailed description.

To achieve the above objectives, pursuant to an embodiment of the present invention, at least one blocking member is provided for restricting melted mold spread when a semiconductor chip is molded whereby, the blocking member is formed as a portion within a metallic layer disposed on an insulating tape together with metallic leads and positioned corresponding to one or more corners of an aperture where the semiconductor chip is positioned to be molded. The blocking member is also arranged beside the metallic leads which are bonded at wire bonding area thereof to bumps formed on the semiconductor chip. All of the blocking member, the metallic leads, and the semiconductor chip are molded after wire bonding between the metallic leads and the bumps.

In another embodiment of the present invention, the blocking member is provided as extended portions of the metallic leads which are positioned corresponding to one or more corners of the aperture.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENT

Figure 1:
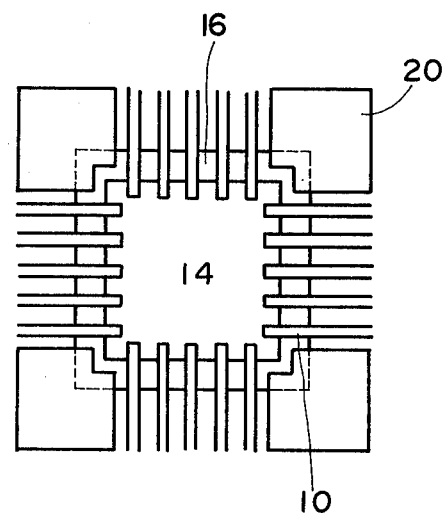
FIG. 1 is a plan view of an embodiment of a metallic layer of the present invention including a molded semiconductor chip.
Figure 2:
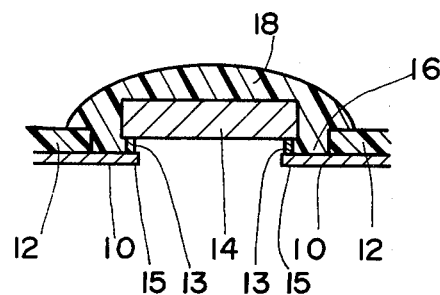
FIG. 2 is a cross sectional view of the metallic layer and the molded semiconductor chip shown in FIG. 1.

FIGS. 1 and 2 illustrate a metallic layer of the present invention, wherein metallic leads 10, a blocking member 20, and an aperture 16 are provided. An electronic unit 14 is disposed within the aperture 16 so that bumps 13 formed on the electronic unit are wire-bonded together with wire bonding area 15 of the metallic leads 10.

The metallic layer of metallic electrically conducting material is secured to an insulating tape 12, at least in regions of the insulating material adjacent apertures 16, by any suitable means, such as adhesive lamination. The metallic layer may be a thin foil-like strip. The aperture 16 are provided within the insulating tape 12 by means of pre-punched methods so that the diameter of the aperture 16 preferably is of a size adapted to contain within the periphery thereof the bumps 13 of the electronic unit 14. Insulating material suitable for the insulating tape 12 is, for example, an organic resin such as the polyester known commercialy as Mylar, or a polyimide such as kapton (both available from the Du Pont Company, Wilmington, Del.).

Both the plurality of sets of the metallic leads 10 and the blocking members 20 are provided within the metallic layer by photolithographic masking and etching, or other suitable known techniques. The metallic leads 10 and the blocking member 20 are adjacent the aperture 16 and arranged in a predetermined pattern of generally radial fingers extending cantilever-wise inwardly beyond the periphery of the aperture 16. The inner portions of the metallic leads 10 may be wire-bonded in wire bonding area 15 with bumps 13 on the electronic unit 14 disposed opposite the aperture 16 using a bonding tool, whereby the electronic unit 14 is supported by and, simultaneously, electrically connected to the metallic leads 10.

The blocking members 20 are provided for limiting melted mold spread when the electronic unit 14 is molded. The blocking members 20 are positioned at four corners of the aperture 16. The molding process is performed through the use of suitable mold material 18 such as a resin which is disposed only on the side where the electronic unit 14 is disposed on the metallic layer as shown in FIG. 2. The spread of the mold material 18 is restricted between the blocking member 20 and the metallic leads 10 and between each of the metallic leads 10 by means of surface tension. Therefore, the mold material 18 must not flow out into the another side of the metallic layer where the electronic unit 14 does not exist. All of the blocking members 20, the metallic leads 10, and the electronic unit 14 are molded after wire bonding between the bumps 13 and the wire bonding area 15.

Figure 3:
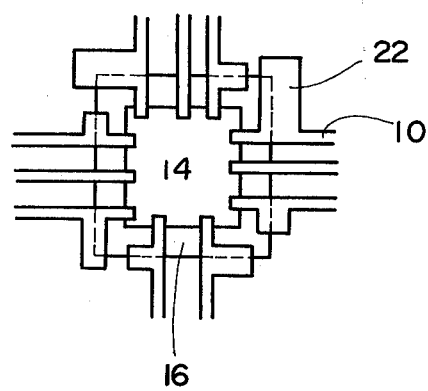
FIG. 3 is a plan view of another embodiment of the metallic layer of the present invention including the molded semiconductor chip.

FIG. 3 shows another embodiment using the metallic leads 10 of the present invention, wherein extension portions 22 are provided within the metallic leads 10 which function as the above-described blocking member 20, the metallic leads 10 being positioned at the four corners of the aperture 16. Beside one corner of the aperture 16, two extension portions 22 are formed, each being included within one metallic lead 10.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A multiple-lead frame member comprising a semiconductor unit disposed within an aperture, a plurality of metallic lead connectors bonded to said semiconductor unit by bump means, and blocking means provided for limiting mold spread when the semiconductor unit is molded, said blocking means being positioned at at least one corner of said aperture and being composed of a metallic material common to said leads, wherein the semiconductor unit is disposed in a predetermined pattern extending cantileverwise inwardly, beyond the periphery of the aperture.

2. The multiple-lead frame member of claim 1, wherein the blocking member is disposed at all corners of the aperture wherein the semiconductor unit is disposed.

3. The multiple-lead frame member as specified in claim 1, wherein the blocking means is an extended portion of at least one lead connector which is positioned at least at one corner of said aperture where the semiconductor unit is disposed.

4. The multiple-lead frame member as specified in claim 1, wherein the blocking means has an approximately rectangular shape.

5. The multiple-lead frame member as specified in claim 3, wherein the extended portion has a substantially rectangular shape.

6. The multiple-lead frame member as specified in claim 3, wherein the extended portion is positioned in a predetermined pattern extending cantilever-wise over the periphery of the aperture.

* * * * *